United States Patent
Yoshida et al.

(10) Patent No.: US 6,413,313 B1
(45) Date of Patent: Jul. 2, 2002

(54) APPARATUS FOR PRODUCING POLYCRYSTALLINE SILICON SHEETS AND PRODUCTION METHOD USING THE SAME

(75) Inventors: Koji Yoshida, Minamikawachi-gun; Kozaburo Yano, Nabari; Kazuto Igarashi, Kitakatsuragi-gun; Yoshihiro Tsukuda, Fujiidera; Hidemi Mitsuyasu, Kitakatsuragi-gun, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/660,325

(22) Filed: Sep. 12, 2000

(30) Foreign Application Priority Data

Sep. 14, 1999 (JP) .............................. 11-260742
Aug. 24, 2000 (JP) ....................... 2000-254017

(51) Int. Cl.⁷ .............................................. C30B 35/00
(52) U.S. Cl. ..................... 117/200; 117/204; 117/914
(58) Field of Search ............................... 117/200, 204, 117/914; 438/62, 490, 563

(56) References Cited

U.S. PATENT DOCUMENTS

| 4,305,776 A | 12/1981 | Grabmaier |
| 4,341,589 A | 7/1982 | Grabmaier |
| 4,447,289 A | 5/1984 | Geissler et al. |
| 4,688,623 A | * 8/1987 | Wakefield et al. |
| 4,778,478 A | * 10/1988 | Barnett |
| 5,712,199 A | 1/1998 | Nakagawa et al. |
| 6,171,396 B1 | * 1/2001 | Tahara ........................ 117/204 |

FOREIGN PATENT DOCUMENTS

| JP | 6-64913 | 3/1994 |
| JP | 7-256624 | 10/1995 |
| JP | 10-29895 | 2/1998 |

OTHER PUBLICATIONS

Cammerer et al., "State of the Development in Manufacturing Solar Cells and Modules Made from S–WEB SI Ribbons", Photovoltaic Specialists Conference, U.S., New York, IEEE, vol. CONF. 20, Sep. 26, 1998, pp. 1409–1411.
Uno et al., "Rapid Cast Silicon Ribbon", Photovoltaic Specialists Conference, U.S., New York, IEEE, vol. CONF. 18, Oct. 21, 1985, pp. 988–992.

* cited by examiner

Primary Examiner—Felisa Hiteshew
(74) Attorney, Agent, or Firm—Nixon & Vanderhye P.C.

(57) ABSTRACT

An apparatus for producing a polycrystalline silicon sheet includes a crucible, a heating unit for heating a starting material of silicon fed in the crucible, and a cooling unit for contacting a melt of the starting material melted by heating to a cooling face of a cooling member, thereby obtaining a polycrystalline silicon sheet in which crystals of silicon are grown, wherein the cooling face of the cooling member has a sheet adhering portion for providing a silicon starting point of crystallization and allowing adhesion of the polycrystalline silicon sheet of grown crystals and a sheet stripping portion for allowing easy stripping of the polycrystalline silicon sheet.

10 Claims, 9 Drawing Sheets

APPARATUS FOR PRODUCING POLYCRYSTALLINE SILICON SHEETS AND PRODUCTION METHOD USING THE SAME

CROSS-REFERENCE TO RELATED APPLICATION

This application is related to Japanese Patent Applications No. Hei 11(1999)-260742 filed on Sep. 14, 1999 and 2000-254017 filed on Aug. 24, 2000, whose priorities are claimed under 35 USC §119, the disclosure of which is incorporated by reference in its entirety.

BACKGROUND OF THE INVENTION

1. Field of the Invention

The present invention relates to an apparatus for producing polycrystalline silicon sheets which are materials for silicon wafers usable for solar cells and others and a production method using the apparatus.

2. Description of Related Art

Polycrystalline silicon wafers to be used for solar cells and the like are produced, for example, by melting with heat a high-purity silicon material to which a dopant such as phosphorus, boron or the like is added, in an inert atmosphere in a crucible, casting the resulting silicon melt (referred to as melt for short hereinafter) into a mold, gradually cooling the melt to obtain a polycrystalline ingot and slicing the ingot with a wire saw or an inner diameter blade, thereby obtaining desired wafers (see Japanese Unexamined Patent Publication No. HEI 6(1994)-64913). Since this method requires a slicing process, slicing loss corresponding to the thickness of a wire or an inner diameter blade occurs. That decreases the yield of wafers and as a result it is impossible to supply the wafer at low prices.

Also disclosed is a method for producing silicon sheets without need of slicing the ingot (see Japanese Unexamined Patent Publication No. HEI 7(1995)-256624). According to this method, silicon melt is fed into a heating horizontal mold. A carbon plate is moved in a horizontal direction and contacted directly to the melt. When the melt is stuck to the plate, the plate is drawn away horizontally and cooled by cooling gas blown by a gas blow portion of a cooling system. Thus silicon sheets are continuously obtained. According to this method, since the thickness of silicon sheets is controlled by a thickness control plate, it is impossible to control the thickness to 400 μm or less, which is required for solar cells.

Japanese Unexamined Patent Publication No. HEI 10(1998)-29895 discloses an apparatus and a method for producing polycrystalline silicon sheets by which silicon melt obtained by melting a silicon material by a heater in a crucible is contacted to a rotary cooling member of a heat-resistant material having a rotary shaft parallel to the surface of the melt, while cooling the rotary cooling member with liquefied nitrogen gas, so as to grow silicon crystals on the surface of the rotary cooling member, and the silicon crystals are stripped from the rotary cooling member to give a polycrystalline silicon sheet.

Crystals of polycrystalline silicon sheets produced by the apparatus and method disclosed by the above-mentioned Japanese Unexamined Patent Publication No. HEI 10(1998)-29895 grow in columnar form but the size of the crystals is not precisely controlled. Therefore, it is necessary to pay the closest attention to the control of temperature distribution of the melt, rotation speed of the rotary cooling member and others for maintaining high quality of polycrystalline silicon sheets for solar cells. If these conditions change even slightly, the crystals growing on the surface of the cooling member exhibit a dendrite structure of tree branch-like elongate crystals, which are not suitable for the solar cells.

The above-mentioned Japanese Unexamined Patent Publication No. HEI 10(1998)-29895 discloses in its claim 3 an apparatus for producing polycrystalline silicon sheets which forms polycrystalline silicon sheets on the surface of a rotary cooling member coated with a ceramic sheet such as boron nitride by contacting the rotary cooling member with silicon melt. However, since the surface of the rotary cooling member of this apparatus is entirely covered with the ceramic film, the entire surface of the rotary cooling member serves as a nuclei for crystal growth. Accordingly, the polycrystalline silicon sheets cannot be easily stripped from the surface of the rotary cooling member, that is, a sufficient stripping property cannot be obtained, when the sheets are continuously taken away from the surface of the rotary cooling member.

SUMMARY OF THE INVENTION

In view of the above-mentioned problems, an object of the present invention is to provide an apparatus and a method for producing polycrystalline silicon sheets which allow silicon crystals to grow in good form and also provide easy stripping of the polycrystalline silicon sheets from the surface of a cooling member.

The present invention provides an apparatus for producing a polycrystalline silicon sheet comprising a crucible; a heating unit for heating a starting material of silicon fed in the crucible; and a cooling unit for contacting a melt of the starting material melted by heating to a cooling face of a cooling member, thereby obtaining a polycrystalline silicon sheet in which crystals of silicon are grown, wherein the cooling face of the cooling member has a sheet adhering portion for providing a silicon starting point of crystallization (i.e., crystallization growth point) and allowing adhesion of the polycrystalline silicon sheet of grown crystals and a sheet stripping portion for allowing easy stripping of the polycrystalline silicon sheet.

The sheet adhering portion formed on the cooling face serves as the starting point of crystallization for allowing growth of silicon crystals and adhesion of the polycrystalline silicon sheet, while the polycrystalline silicon sheet adheres only weakly or does not adhere substantially to the sheet stripping portion provided in the rest of the cooling face. Thus it is possible to attain both the adhesion property and the easy stripping property for the polycrystalline sheet which forms as the crystals grow.

In other words, by arranging the sheet stripping portion, which has so weak adhesive force to the sheet that it cannot be a substantial sheet adhering member by itself, and the sheet adhering portion, which has a strong adhesive force to the sheet and can compensate for the weak adhesive strength of the sheet stripping portion to the sheet or is responsible for the adhesion to the sheet, in an appropriate relationship, it is possible to obtain a polycrystalline silicon sheet having a desired crystal form growing from the sheet adhering portion as the starting point of crystallization as well as to strip the obtained sheet easily without need to use a stripping agent as conventionally used.

Difference in the adhesive force to the polycrystalline silicon sheet between the sheet adhering portion and the sheet stripping portion is based on their different shapes and/or materials. An optimal difference in the adhesive force can be established for acquiring both good adhesion and easy stripping of the sheet by controlling conditions such as the temperature of the starting material melt when the melt is contacted to the cooling face to grow silicon crystals, the temperature of the cooling face, contact time and the like.

In the polycrystalline silicon sheet produced by the apparatus for producing polycrystalline silicon sheets of the present invention, the silicon crystals grow in a columnar form from the sheet adhering portion as the starting point of crystallization. Thus it is possible to obtain polycrystalline silicon sheets suitable for solar cells and the like.

Furthermore, since the resulting polycrystalline silicon sheet can be easily stripped from the cooling face without use of a stripping agent, it is possible to produce polycrystalline silicon sheets continuously.

The sheet stripping portion in the present invention is formed of a material having a relatively weak adhesive force to the polycrystalline silicon sheets by itself. Such a material may preferably be carbon because it is heat resistant and it does not inhibit crystallization of silicon.

The sheet adhering portion in the present invention is different in shape and/or material from the sheet stripping portion. As for its shape, the sheet adhering portion may have dots arranged regularly or random on the cooling face. Examples of such dots include a plurality of columnar or polygonal studs having flat or curved heads or sides to provide small areas for growing crystals on surfaces of the studs as starting points of crystallization.

The heads or sides of the studs arranged in dots serve as the starting points of crystallization and allow adhesion of the formed polycrystalline silicon sheet.

The sheet adhering portion may have a surface area occupying preferably 0.1 to 25%, more preferably 1 to 10%, of the cooling face. The surface area of the above-mentioned stud may mean the surface area of its head, i.e., the area of an image of the stud projected on the cooling face, since the surface area of the sides of the stud is negligible as compare with that of the head of the stud. If the surface area of the sheet adhering portion is smaller than 0.1% the adhesive force of the polycrystalline silicon sheet is not enough, and if its surface area is larger than 25%, the polycrystalline silicon sheet may be damaged when it is stripped from the sheet adhering portion.

The above-mentioned dots of the sheet adhering portion may have a diameter of 1 to 500 $\mu$m and a height of 4 to 100 $\mu$m, for example, if they have a columnar shape.

The material for the dots is not particularly limited so long as it exhibits heat resistance at temperatures higher than the melting point of silicon and it can be easily made in dots on the cooling face, but it may preferably be a ceramic since ceramic can be easily shaped on carbon. Carbon is typically used for the cooling face. The ceramic may contain any one of silicon carbide, silicon nitride and boron nitride, for example.

In the present invention, the sheet adhering portion is preferably comprised of ceramic dots arranged on the cooling face. This is because ceramics are considered to be able to provide starting point of crystallizations suitable for growth of silicon crystals.

The cooling unit may have the cooling face in part of its flat face or may be a rotary cylinder having the cooling face on its periphery. If the cooling unit is the latter, i.e., a rotary cylinder, polycrystalline silicon sheets can be continuously produced.

In another aspect of the present invention, the cooling member may include a plurality of cooling member pieces each having a flat cooling face, the cooling member pieces being connected to each other in a caterpillar form, and the caterpillar-formed cooling member pieces revolves in an up-and down direction with respect to the crucible in such a manner that one to fifty of the cooling faces of the revolving cooling member pieces contact the melt sequentially. With this construction, the apparatus of the present invention will be more suitable for mass production because polycrystalline silicon sheets can be continuously produced. The apparatus for producing polycrystalline silicon sheets having this type of cooling unit may further include a sheet stripping mechanism provided with at least one suction case having at a distal end a porous surface disposed to face the cooling faces of the revolving cooling member pieces and with a vacuum pump for, when the suction case faces the cooling face of the cooling member piece to which the polycrystalline silicon sheet adheres, sucking the inside of the suction case from a proximal side to take the polycrystalline silicon sheet onto the porous surface by suction. With this construction, more efficient mass production can be realized.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Embodiments of the apparatus and method for producing polycrystalline silicon sheets of the present invention are now explained with reference to FIGS. 1 to 7. However, these embodiments should not be construed to limit the scope of the invention.

First Embodiment

Figure 1:
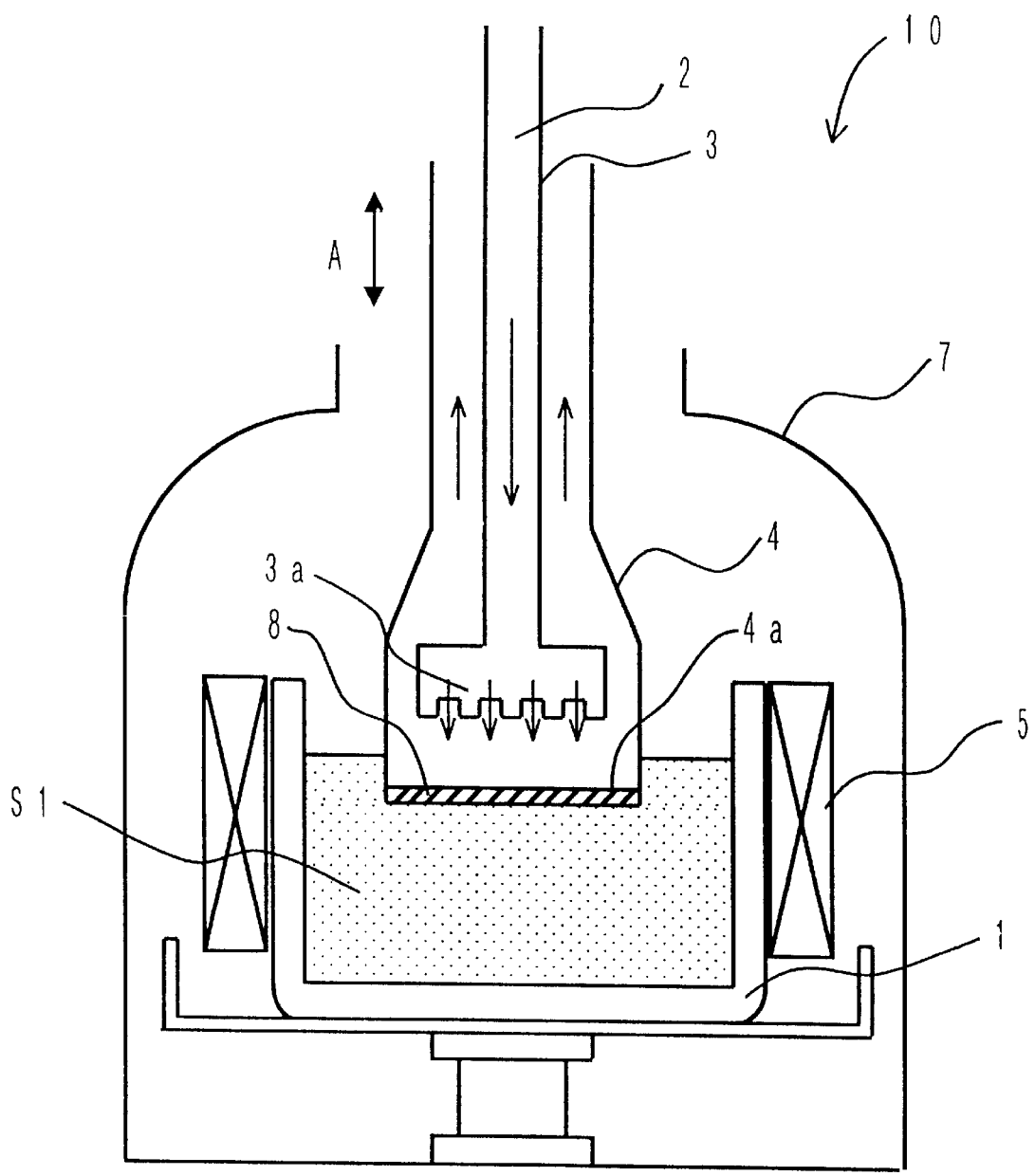
FIG. 1 is a schematic elevational view in section illustrating an embodiment of the apparatus for producing polycrystalline silicon sheets of the present invention.

FIG. 1 shows a basic structure of an apparatus for producing polycrystalline silicon sheets in accordance with the present invention. In FIG. 1, a polycrystalline silicon sheet producing apparatus 10 comprises a chamber 7, a crucible 1 placed substantially at the center in the chamber 7 for accommodating a silicon mass as a starting material, a conduit 3 made of stainless steel for introducing a refrigerant 2, a cooling unit 4 in which the conduit 3 is disposed and which is located above the crucible 1 and a heater 5 as a heating unit.

The chamber 7 is connected to a source (not shown) for supplying an inert gas such as helium, nitrogen and argon and a vacuum pump (not shown). The crucible 1 is made of carbon, and the heater 5 is provided along the periphery of the crucible 1. The heater 5 has a resistance heating element made of carbon for melting with heat the silicon mass accommodated in the crucible 1 to give a silicon melt S1 at a desired temperature and also has a temperature regulating mechanism.

For strictly controlling the temperature of the melt S1 and obtaining a polycrystalline silicon sheet S2 with a good reproducibility, a plurality of heaters 5 are preferably installed. The temperature of the melt S1 is equal to or higher than about 1,420° C. which is the melting point of silicon. However, if the temperature of the melt S1 is close to the melting point of silicon, the melt S1 may possibly solidify at its surface on contacting the cooling unit 4. This is why the temperature of the melt S1 is preferably about 1,430° C. or higher.

The cooling unit 4 is formed in a carbon cylinder having a cooling face 4a of a cooling member at its bottom. The cooling face 4a is formed on a bottom surface of a carbon plate 8 having one rectangular plane.

The cooling unit 4 is connected to an elevating means (not shown) for enabling up-and-down movement of the cooling unit 4 in a direction of arrow A in the figure.

The conduit 3 discharges the refrigerant 2 sent from a refrigeration cycle (not shown) out of a porous nozzle at a distal end 3a toward the carbon plate 8 having the cooling face 4a. The refrigerant 2 passes between an outside wall of the conduit 3 and an inside wall of the cylinder of the cooling unit 4 and is lead out to the refrigeration cycle.

Figure 2:
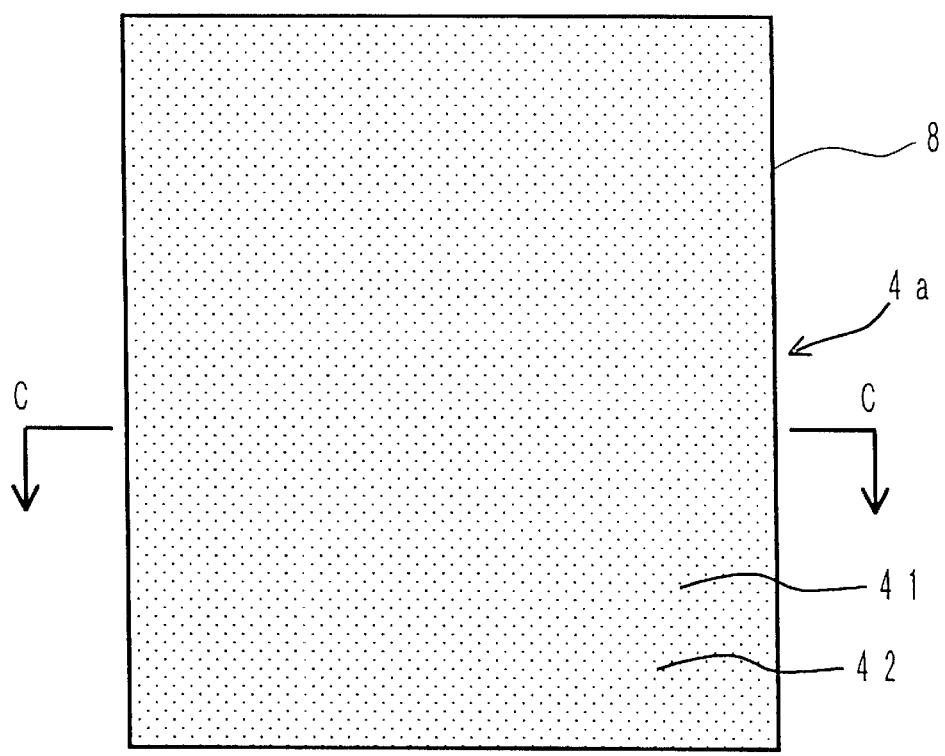
FIG. 2 is a bottom view of a cooling face of a cooling member shown in FIG. 1.
Figure 3:
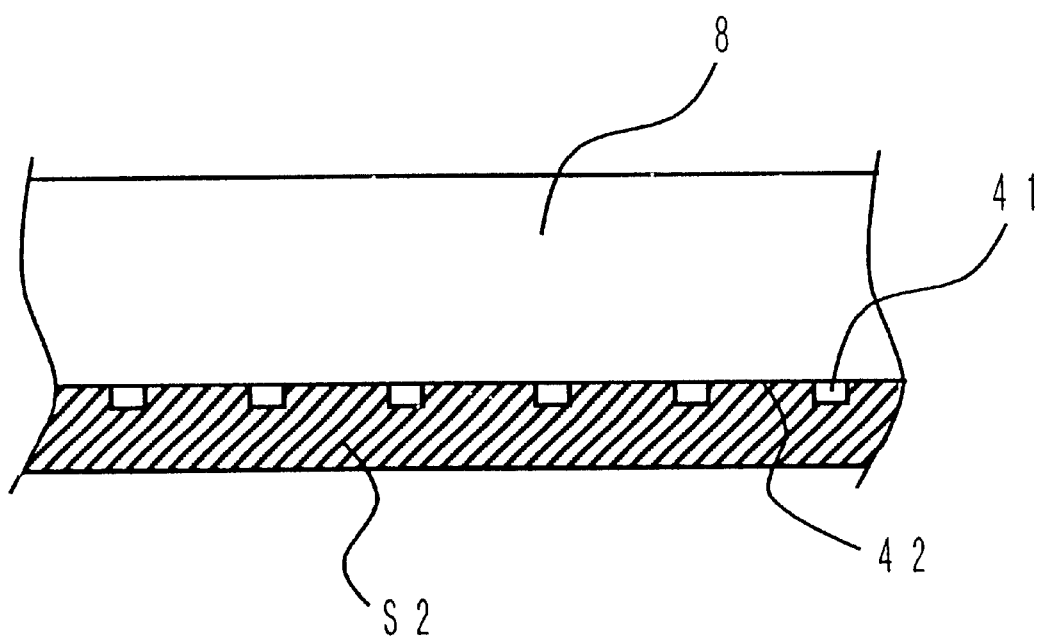
FIG. 3 is an enlarged partial sectional view of the cooling face of the cooling member of FIG. 2 taken along line C—C in FIG. 2.

As shown in a bottom view of FIG. 2 and an enlarged sectional view of FIG. 3 taken along line C—C of FIG. 2, the cooling face 4a is comprised of a sheet adhering portion 41 serving as a starting point of crystallization for silicon and allowing the adhesion of a sheet of grown crystals and a sheet stripping portion 42 having a surface facilitating the stripping of the sheet.

The sheet adhering portion 41 is formed in dots of a ceramic such as silicon carbide, silicon nitride or boron nitride at a uniform dot density by providing a carbon mask or the like on the bottom of the carbon plate 8 and then using thermal CVD.

The sheet stripping portion 42 is the rest of the cooling face 4a where the sheet adhesion portion 41 is not formed. In the sheet stripping portion 42, the carbon plate 8 is exposed as uncovered and does not allow easy adhesion of the resulting polycrystalline silicon sheet.

In the polycrystalline silicon sheet producing apparatus 10, the cooling face 4a is immersed in the melt S1 for a certain time and then picked up from the melt S1 while the cooling face 4a is kept almost parallel to the surface of the melt S1. Thus, a polycrystalline silicon sheet S2 is obtained on the cooling face 4a. The adhesion of the polycrystalline silicon sheet S2 to the cooling face 4a is mainly due to spot contact provided by the dots of the sheet adhering portion 41 as adhering points. In the other part of the cooling face 4a, i.e., in the sheet stripping portion 42, the adhesion of the polycrystalline silicon sheet S2 is so weak that the sheet can be easily stripped from the cooling face 4a.

At this time, the ceramic dots formed as the sheet adhering portion 41 on the carbon plate 8 have stronger adhesive force to the surface of the carbon plate 8, which force has been generated when the carbon dots have been formed on the carbon plate 8 by CVD, than its adhesive force to the polycrystalline silicon sheet S2. Therefore, when the polycrystalline silicon sheet S2 is stripped from the cooling face 4a, the sheet adhering portion 41 does not come off the surface of the carbon plate 8 and can be used repeatedly.

For stripping the polycrystalline silicon sheet S2 from the cooling face 4a, used is a stripping mechanism by suction with a vacuum pump as shown in an embodiment described later.

The obtained polycrystalline silicon sheet S2 forms columnar crystals growing from the dots of the sheet adhering portion 41 as their starting points of crystallization and having their peaks there. Accordingly, the resulting sheet S2 is suitable for solar cells and the like.

The thickness of the polycrystalline silicon sheet S2 formed on the cooling face 4a depends upon the temperature of the heater 5, the type and flow rate of the refrigerant 2 flowing through the conduit 3, the depth to which the carbon plate 8 is immersed, and the like. By proper combination of these conditions, it is possible to obtain a polycrystalline silicon sheet S2 with a desired thickness.

Second Embodiment

FIGS. 4 to 7 show another embodiment of an apparatus for producing polycrystalline silicon sheets in accordance with the present invention. In the aforementioned first embodiment, the cooling unit has one planar cooling face, but this embodiment shows an example of construction in which the cooling unit is a rotary cylinder having a cooling face on its periphery. This construction is more suitable for mass production of polycrystalline silicon sheets.

Figure 4:
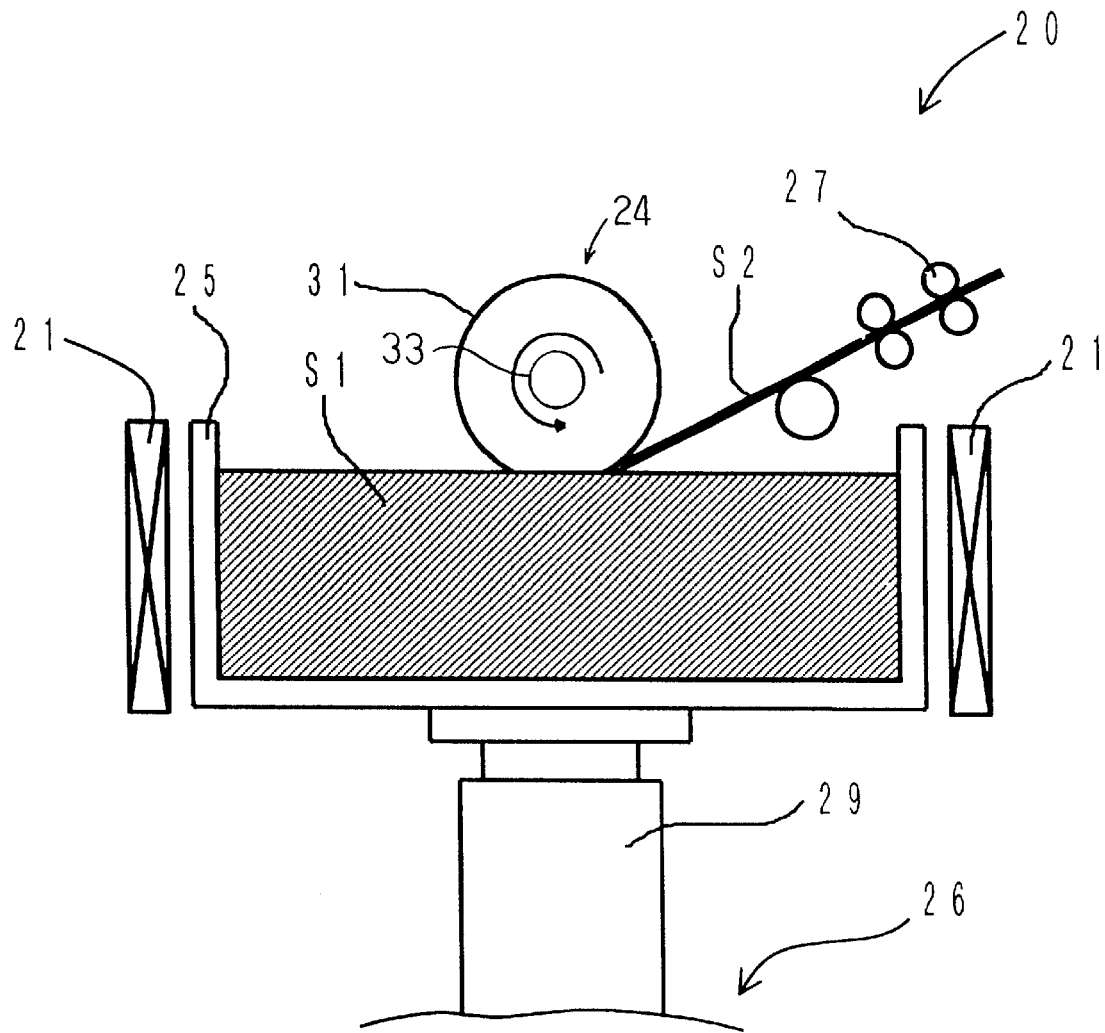
FIG. 4 is a schematic elevational view in section illustrating another embodiment of the apparatus for producing polycrystalline silicon sheets of the present invention.

In FIG. 4, a polycrystalline silicon sheet producing apparatus 20 comprises a crucible 25 placed substantially at the center in the aforesaid chamber 7 (not shown) for accommodating a melt S1, a cooling unit 24 which has a rotary cylinder 31 disposed above the crucible 1, a heater 21 as a heating unit, a crucible elevating section 26 for raising and lowering the crucible 25 with respect to the cooling unit 24 and a take-up section 27 for taking a formed polycrystalline silicon sheet S2. Here mainly explained are the cooling unit 24, the crucible elevation section 26 and the take-up section 27 for taking the polycrystalline silicon sheet S2 which have different constructions from those in the first embodiment.

Figure 5:
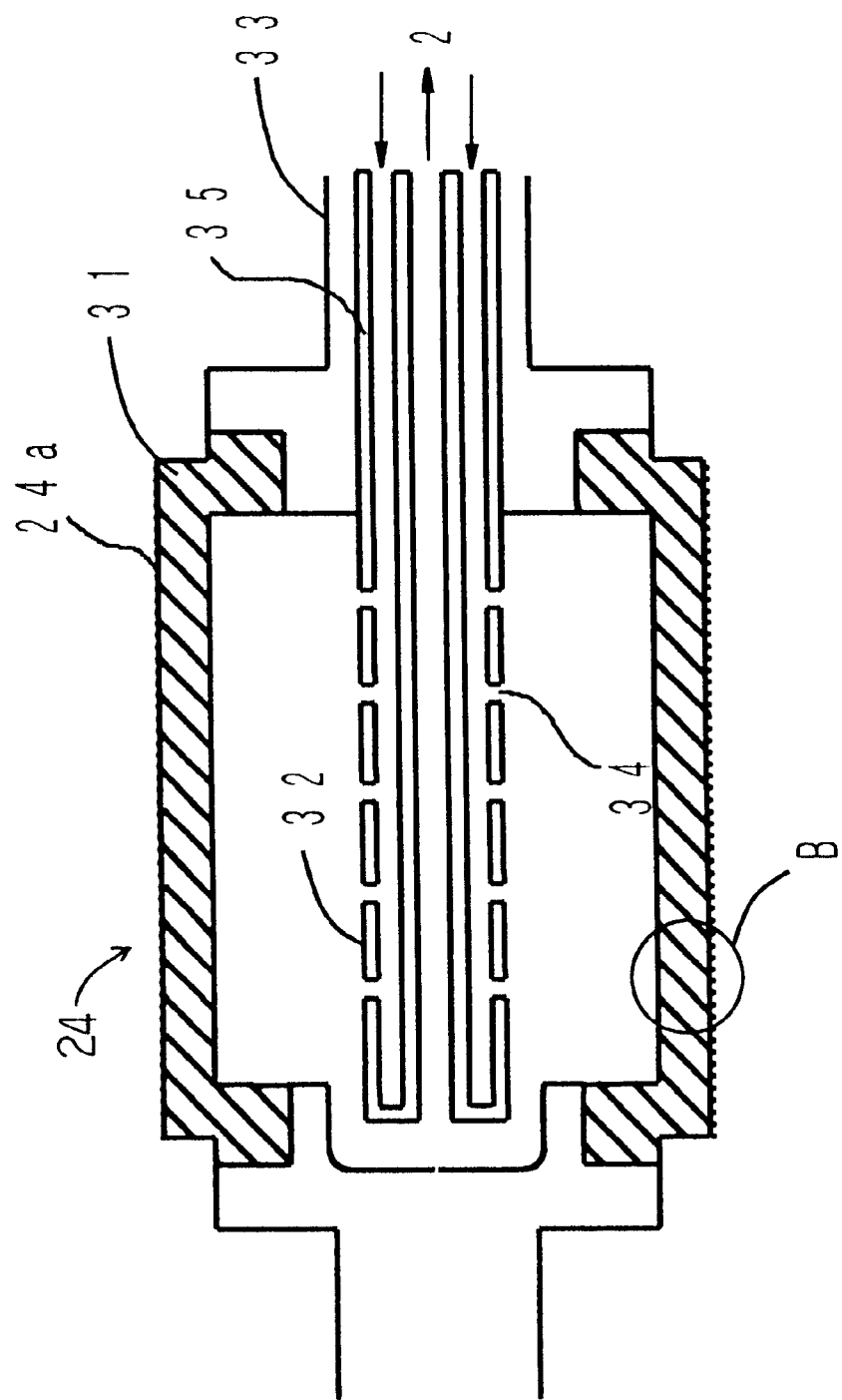
FIG. 5 is an enlarged side view in section of a cooling member shown in FIG. 4.

FIG. 5 is a sectional view of the cooling unit 24. The cooling unit 24 is comprised of a support shaft 33 for a cooling member and a roller-form rotary cylinder 31 attached to the cooling member support shaft 33. The cooling member support shaft 33 is supported within the chamber 7 (not shown) and connected to a motor (not shown) for rotating the support shaft in a direction of an arrow in FIG. 4.

The rotary cylinder 31 is formed of high-purity carbon which is inexpensive and excellent in workability and attached to a larger-diameter part of the cooling member support shaft 33 unrotatably with respect to the cooling member support shaft 33. Other materials usable for the rotary cylinder 31 may include heat-resistant materials such as fire resistant ceramics, silicon nitride, boron nitride and the like.

A nozzle 32 for discharging the refrigerant having a plurality of refrigerant outlets 34 is provided within the rotary cylinder 31. A proximal end of the nozzle 32 is connected to a refrigeration cycle (not shown) via a refrigerant conduit 35 passing through the inside of the cooling member support shaft 33.

The nozzle 32 is fixed unrotatably to the rotary cylinder 31 in such a way that the refrigerant contacts the entire back face of the cooling face 24a uniformly. The refrigerant outlets 34 are preferably arranged radially along the axial line of the nozzle 32 so that the refrigerant contacts the entire back face of the rotary cylinder 31 uniformly. However, if the refrigerant outlets 34 are disposed inside of a part of the cooling face 24a which is immersed in the melt S1 and in a position opposed to a part immediately before said part, the refrigerating ability of the refrigeration cycle does not need to be increased.

Figure 6:
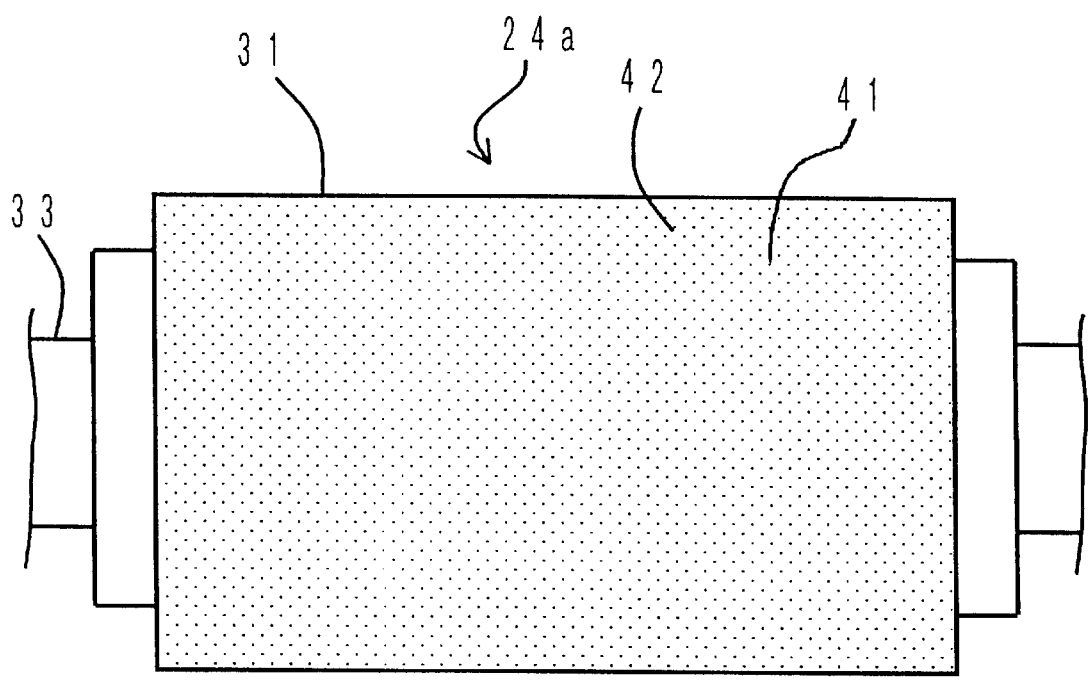
FIG. 6 is an enlarged side view of the cooling member shown in FIG. 4.

The cooling face 24a on the rotary cylinder 31 is comprised of a sheet adhering portion 41 serving as a starting point of crystallization for silicon and allowing the adhesion of a sheet of grown crystals and a sheet stripping portion 42 having a surface facilitating the stripping of the sheet, as shown in the front view of FIG. 6.

Figure 7:
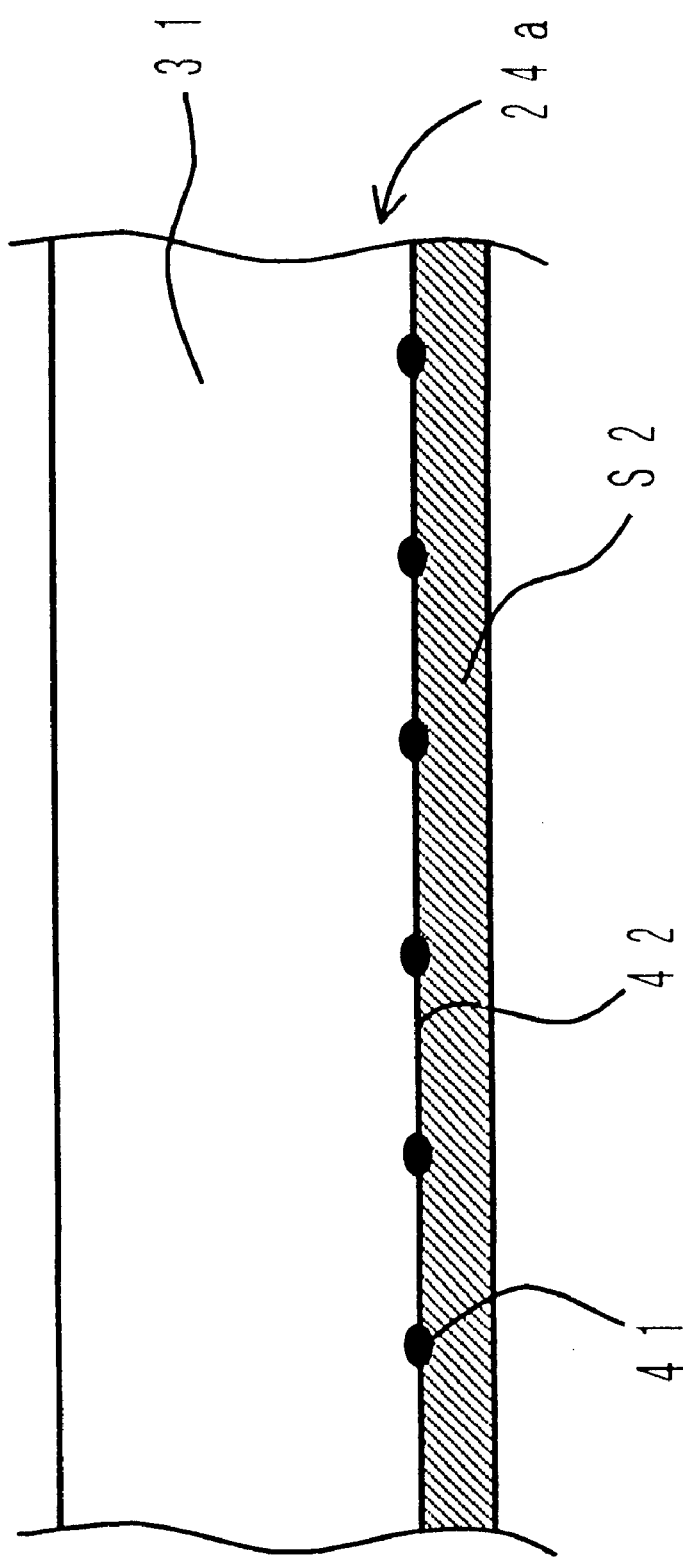
FIG. 7 is an enlarged sectional view of a portion B in FIG. 5 illustrating a sheet adhering section on the cooling face of the cooling member as well as a state in which a polycrystalline silicon sheet has grown.

FIG. 7 is an enlarged sectional view of a part B in FIG. 5. The sheet adhering portion 41 is formed in dots of a ceramic such as silicon carbide, silicon nitride or boron nitride at a uniform dot density by providing a carbon mask or the like on the periphery of the rotary cylinder 8 made of carbon and then using thermal CVD.

The sheet stripping portion 42 is the rest of the cooling face 24a where the sheet adhesion portion 41 is not formed. In the sheet stripping portion 42, the rotary cylinder 31 made of carbon is exposed as uncovered and does not allow easy adhesion of the resulting polycrystalline silicon sheet.

The thickness of the polycrystalline silicon sheet S2 formed on the cooling face 24a depends upon the temperature of the heater 21, the type and flow rate of the refrigerant flowing within the rotary cylinder 31, the rotation speed of the rotary cylinder 31 and the like. By proper combination of these conditions, it is possible to obtain a polycrystalline silicon sheet S2 with a desired thickness.

The depth to which the rotary cylinder 31 is immersed in the melt S1 is adjusted by the crucible elevating section 26 for raising and lowering the crucible 25 (see FIG. 4). The thickness of the polycrystalline silicon sheet S2 formed on the cooling face 24a is also controlled by adjusting this immersion depth.

An example of elevating means of the crucible elevating section 26 may be a mechanism comprised of a ball screw, a moving element which engages with the ball screw and rotatably supports a support shaft 29 and a motor for driving and rotating the ball screw.

Feeding an additional polycrystalline silicon ingot or silicon powder sequentially may be mentioned as means for maintaining the level of the surface of the melt S1.

The polycrystalline silicon sheet S2 of crystals grown on the cooling face 24a of the cooling unit 24 is taken out of the crucible 25 by guide rollers of the take-up section 27 in which a plurality of roller pairs are provided in series in a direction of taking up the polycrystalline silicon sheet S2 and then carried out of the chamber (not shown).

The polycrystalline silicon sheet S2 is cut into a desired size (length) using a micro cutter, a YAG laser or the like. Thus a silicon wafer is completed.

Third Embodiment

Figure 8:
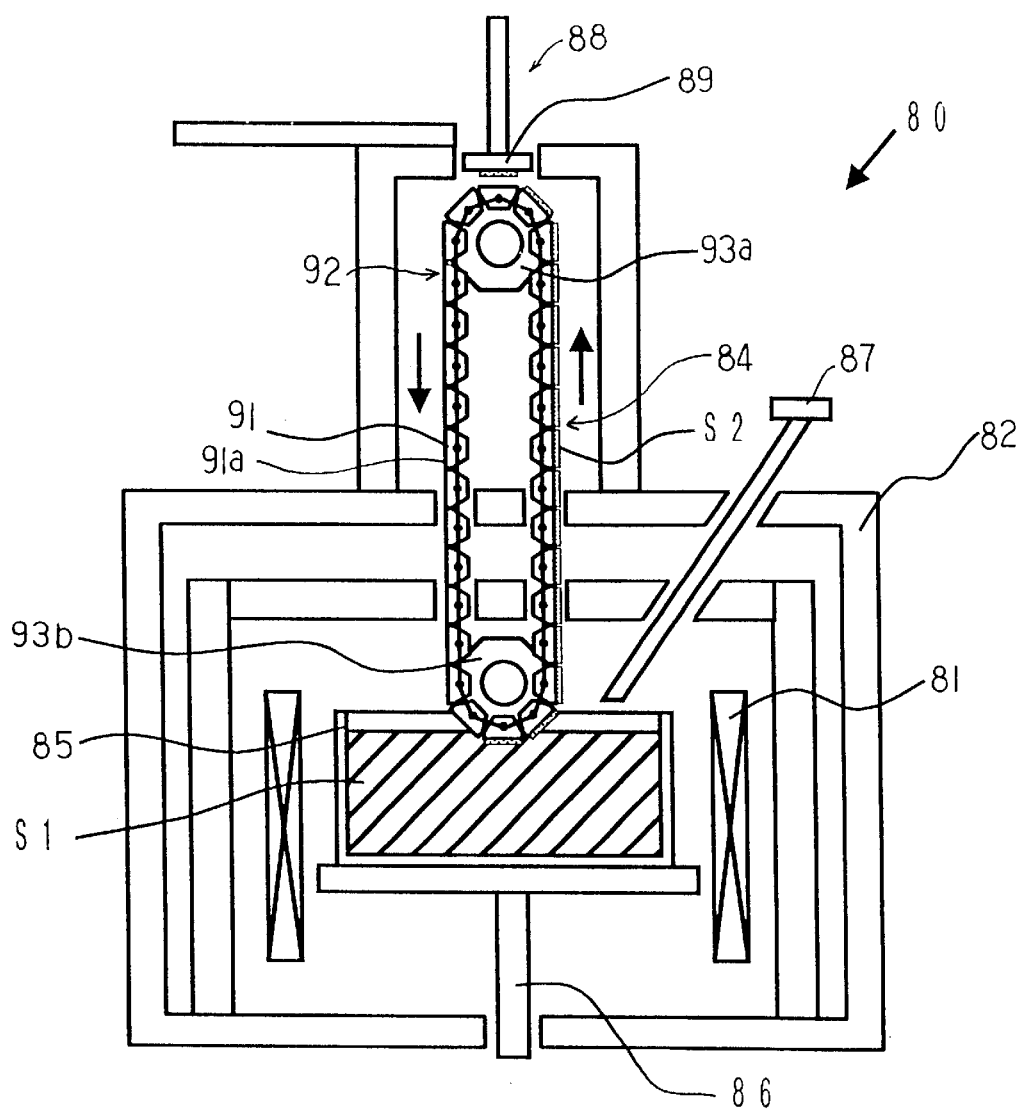
FIG. 8 is a schematic elevational view in section illustrating still another embodiment of the apparatus for producing polycrystalline silicon sheets of the present invention.
Figure 9:
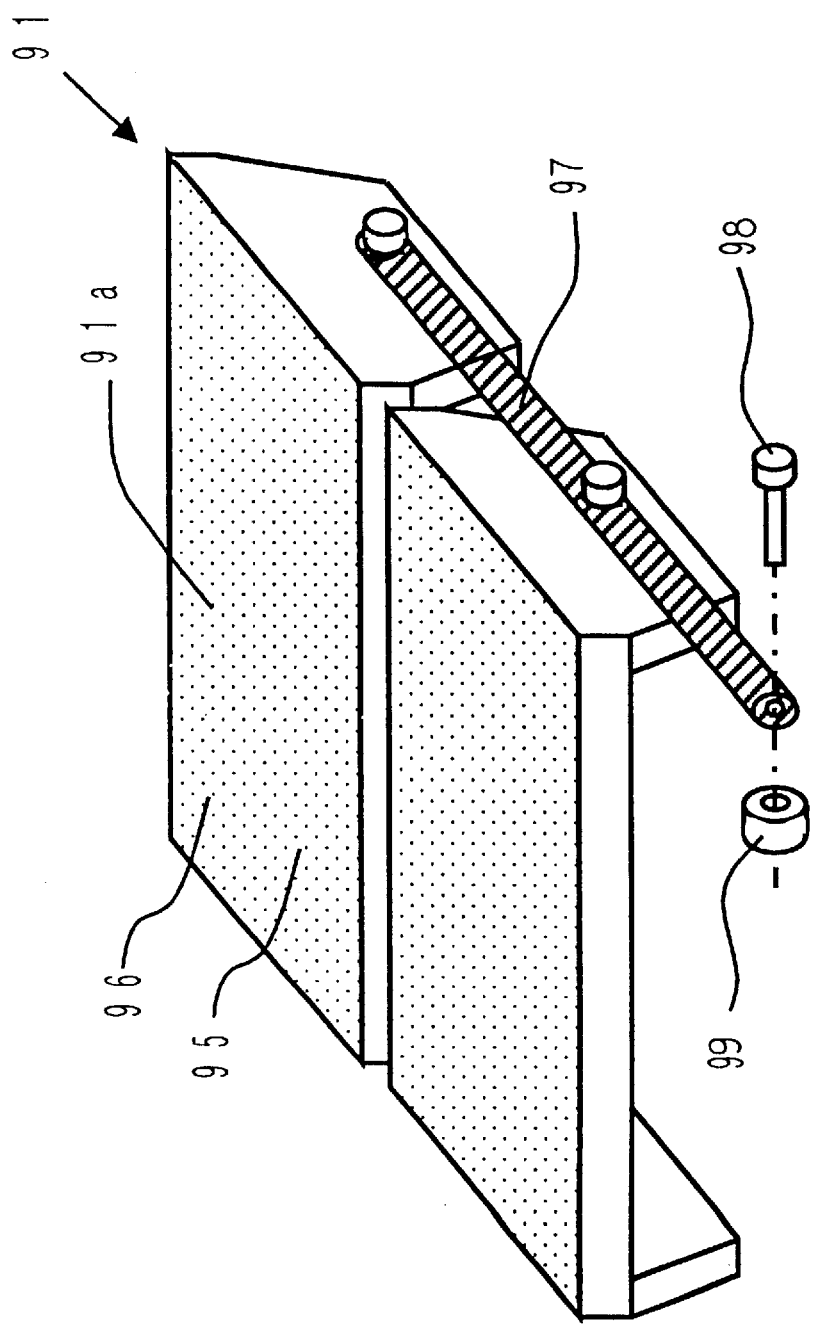
FIG. 9 is a partial perspective view of a cooling member pieces shown in FIG. 8.

FIGS. 8 to 9 show still another embodiment of an apparatus for producing polycrystalline silicon sheets in accordance with the present invention. In the aforementioned second embodiment, the cooling unit is the rotary cylinder having the cooling face on its periphery, but this third embodiment shows an example of construction in which the cooling unit includes cooling pieces having flat surfaces connected to each other in a caterpillar form. This construction is more suitable for mass production of polycrystalline silicon sheets.

In FIG. 8, a polycrystalline silicon sheet producing apparatus 80 comprises a chamber 82, a crucible 85 placed substantially at the center in the chamber 82 for accommodating a melt S1, a cooling unit 84 disposed above the crucible 85, a heater 81 as a heating unit, a crucible elevating section 86 for raising and lowering the crucible 85, a material supply section 87 for supplying a starting material for silicon crystals to the crucible 85 and a stripping mechanism 88 for stripping the resulting polycrystalline silicon sheet S2 from the cooling unit 84. Here, mainly explained are the cooling unit 84 and the stripping section 88 having different constructions from those in the first and second embodiments.

As shown in FIG. 8, the cooling unit 84 is comprised of a cooling member belt 92 of a plurality of cooling plates (cooling member pieces) 91 connected to each other in a caterpillar form and a pair of sprockets 93a and 93b for entraining the cooling member belt 92 revolvably in an up-and-down direction.

FIG. 9 shows the cooling plates 91 of the cooling member belt 92 and their connection mechanism.

A cooling face 91a on the cooling plate 91 having a substantially flat surface is comprised of a sheet adhering portion 95 serving as a starting point of crystallization for silicon and allowing the adhesion of a sheet of grown crystals and a sheet stripping portion 96 having a surface facilitating the stripping of the sheet. The sheet adhering portion 95 is formed in dots of a ceramic such as silicon carbide, silicon nitride or boron nitride at a uniform dot density by providing a carbon mask or the like on the surface of the cooling plate 91 made of carbon and then using thermal CVD.

The sheet stripping portion 96 is the rest of the surface of the cooling plate 91 where the sheet adhesion portion 95 is not formed. In the sheet stripping portion 96, the surface of the cooling plate 91 made of carbon is exposed as uncovered and does not allow easy adhesion of the resulting polycrystalline silicon sheet.

The cooling plates 91 are connected to each other by means of a connection member 97 to form the cooling member belt 92 in the caterpillar form. Each of the cooling plates 91 is attached pivotally to the connection member 97 with bolts 98 and nuts 99.

The sprockets 93a and 93b shown in FIG. 8 are engageable with the cooling member belt 92 and formed of high-purity carbon which is inexpensive and excellent in workability. Other materials usable for the sprockets may include heat-resistant materials such as fire resistant ceramics, silicon nitride, boron nitride and the like.

In the figure, the upper sprocket 93a is connected to a motor (not shown) for rotating a support shaft. The lower sprocket 93b is provided with a nozzle for discharging a refrigerant which has a plurality of refrigerant outlets as shown in the second embodiment. When the sprocket 93a is rotated, the cooling member belt 92 revolves in the direction of arrows in the figure and the sprocket 93b follows the revolution of the belt 92.

Above the cooling unit 84, provided is a stripping mechanism 88. The stripping mechanism 88 is comprised of a suction case 89 which has, at its distal end, a porous face with a plurality of fine vacuum ports and is opposed to the surface of the cooling plate 91 at a certain distance, and a vacuum pump (not shown) connected to a proximal end of the suction case 89. When the vacuum pump is driven, the striping mechanism takes up by sucking a polycrystalline silicon sheet formed on the cooling face 91a of the cooling plate 91 by means of the distal end of the suction case 89.

In the polycrystalline silicon sheet producing apparatus 80, when the cooling member belt 92 revolves in the direction of the arrows in the figure, the crucible elevating section 86 rises and only the lowermost cooling plate 91 in the figure is immersed in the melt S1 with the cooling face 91a maintained almost in parallel to the surface of the melt S1. After the cooling face 91a of the cooling plate 91 is immersed in the melt S1 for a certain time, the cooling plate 91 is drawn up by continuous or intermittent revolution of the cooling member belt 92. When the cooling face 91a of the cooling plate 91 reaches the position where it is opposed to the distal end of the suction case 89 of the stripping mechanism 88, the vacuum pump is driven and the polycrystalline silicon sheet S2 formed on the cooling face 91a of the cooling plate 91 is taken by suction onto the distal end of the suction case 89.

In the polycrystalline silicon sheet producing apparatus 80, there may be provided a cooling unit 84 having a plurality of cooling member belts 92 in the chamber 82. For example, the apparatus may be so constructed that the cooling member belts 92 are entrained about the sprockets 93a and 93b in parallel in a direction of the shafts of the sprockets 93a and 93b and a single crucible 85 and a single stripping mechanism 88 are used commonly.

The following are conditions common to the above-described first to third Embodiments.

The area for forming dots, i.e. the surface area of the dots with respect to the entire area of the cooling face 4a, 24a or 91a, preferably occupies 0.1 to 25% of the entire area of the cooling face 4a, 24a or 91a in view of their function as nuclei for crystal growth and the stripping property of the polycrystalline silicon sheet from the cooling face. The dots as the sheet adhering portion 41 may be 1 to 500 µm in diameter and 4 to 100 µm in height, for example.

The refrigerant 2 supplied to the cooling unit 4, 24 or 84 is not particularly limited to any type, but inert gases such as nitrogen, helium, argon and the like are preferable. Helium or mixture of helium and nitrogen may be preferable from the viewpoint of a cooling ability, while nitrogen is preferable from the viewpoint of costs.

It is more preferable to use the same kind of gas commonly as the inert gas introduced in the chamber 7 and as the refrigerant supplied to the cooling unit 4, 24 or 84 because the atmosphere in the chamber 7 will not be polluted.

The temperature of the cooling face 4a, 24a or 91a during the growth of crystals is determined on the basis of the temperature of the melt S1, but it may preferably be about 100° C. lower than the melting point of the starting material for the silicon crystals.

Now explained are examples of methods for producing a polycrystalline silicon sheet by use of the polycrystalline silicon sheet producing apparatus in accordance with the present invention.

EXAMPLE 1

With reference to FIGS. 1 to 3, an example of a method for producing a polycrystalline silicon sheet S2 with use of the polycrystalline silicon sheet producing apparatus 10 is described.

Before producing the polycrystalline silicon sheet S2, the sheet adhering portion 41 was formed on the cooling face 4a. First, a mask was formed of a carbon cloth having an aperture ratio of 5% with respect to the main surface of the carbon plate defining the cooling face 4a, and dots were formed of silicon carbide by thermal CVD at a uniform dot density. The dots formed as the sheet adhering portion 41 were 200 µm in diameter and 30 µm in height.

The sheet stripping portion 42 was the rest of the cooling face 4a where the sheet adhering portion 41 was not formed and the carbon plate was exposed as uncovered.

Then, the inside of the chamber 7 was changed to an inert atmosphere of argon. Boron was added to 6.0 kg of a starting silicon material of 6-nine purity, which was suitable for producing solar cells, so that the boron concentration was to be $2 \times 10^{16}/cm^3$ for providing a p-type specific resistance, to give a material for silicon crystals. This material was accommodated in the crucible 1 made of carbon and melted by heating by the heater 5 so that the temperature of the crucible 1 was maintained at 1,550° C., thereby to give the melt S1.

Subsequently, while nitrogen gas was circulated (540 L/min.) as the refrigerant 2 through the conduit 3, the cooling unit 4 made of carbon was lowered so as to immerse the cooling face 4a into the melt S1 for three seconds while keeping the cooling face at a depth of 4 mm from the surface of the melt S1.

After immersion, the cooling unit 4 was raised and taken out of the melt S1. The polycrystalline silicon sheet S2 of 600 µm thickness was formed on the cooling face 4a. Five seconds after taken out, the sheet S2 was able to be stripped easily.

The obtained polycrystalline silicon sheet S2 was made into a solar cell using a usual process of producing polycrystalline solar cells. An open circuit voltage over 560 mV was measured and a fill factor over 0.73 was measured.

EXAMPLE 2

With reference to FIGS. 4 to 7, an example of a method for producing a polycrystalline silicon sheet S2 with use of the polycrystalline silicon sheet producing apparatus 20 is described.

Before producing the polycrystalline silicon sheet S2, the sheet adhering portion 41 was formed on the cooling face 24a. First, a mask was formed of a carbon cloth having an aperture ratio of 3% with respect to the periphery of the carbon cylinder 31 defining the cooling face 24a, and dots were formed of silicon carbide by thermal CVD at a uniform dot density. The dots formed as the sheet adhering portion 41 were 200 µm in diameter and 30 µm in height.

The sheet stripping portion 42 was the rest of the cooling face 24a where the sheet adhering portion 41 was not formed and the surface of the carbon cylinder 31 was exposed as uncovered.

Then, the inside of the chamber 7 was changed to an inert atmosphere of argon. Boron was added to 10 kg of a starting silicon material of 6-nine purity, which was suitable for producing solar cells, so that the boron concentration was to be $2 \times 10^{16}/cm^3$ for providing a p-type specific resistance, to give a material for silicon crystals. This material was accommodated in a quartz crucible 25 protected by a crucible made of high-purity carbon. Subsequently, the inside of the chamber 7 was vacuumed and the pressure in the chamber 7 was reduced to $5 \times 10^{-5}$ torr or lower. Argon gas was introduced into the chamber 7 to recover the atmospheric pressure in the chamber. Thereafter, argon gas was flown at 10 L/min from an upper part of the chamber 7.

Next, the temperature of the heater 21 was set to 1,500° C. A melt S1 without solids was obtained. The silicon material was fed again to adjust the level of the surface of the melt S1. The temperature of the heater 21 was set to 1,430° C. and maintained at that temperature for thirty minutes to stabilize the temperature. Then, nitrogen gas as the refrigerant 2 was blown to the inside of the rotary cylinder 31 at a flow rate of 200 L/min to cool the rotary cylinder 31. The crucible was raised by the crucible elevating section 26 so that the cooling face 24a was immersed at a depth of 4 mm from the surface of the melt. Then the rotary cylinder 31 was rotated at 5 rpm with the cooling face 24a immersed in the melt S1 for three seconds. The obtained polycrystalline silicon sheet S2 was taken out by the take-up section 27.

The obtained polycrystalline silicon sheet S2 was 400 μm in thickness and easily stripped.

The polycrystalline silicon sheet S2 was made into a solar cell using a usual process of producing polycrystalline solar cells. An open circuit voltage over 562 mV and a fill factor over 0.75 were measured.

EXAMPLE 3

With reference to FIGS. 8 to 9, an example of a method for producing a polycrystalline silicon sheet S2 with use of the polycrystalline silicon sheet producing apparatus 80 is described.

Before producing the polycrystalline silicon sheet S2, the sheet adhering portion 95 was formed on the cooling face 91a. First, a mask was formed of a carbon cloth having an aperture ratio of 10% with respect to the main surface of the carbon plate defining the cooling face 91a, and dots were formed of silicon carbide by thermal CVD at a uniform dot density. The dots formed as the sheet adhering portion 95 were 200 μm in diameter and 30 μm in height.

The sheet stripping portion 96 was the rest of the cooling face 91a where the sheet adhering portion 95 was not formed and the carbon plate was exposed as uncovered.

Then, the inside of the chamber 82 was changed to an inert atmosphere of argon. Boron was added to 13 kg of a starting silicon material of 6-nine purity, which was suitable for producing solar cells, so that the boron concentration was to be $2 \times 10^{16}/cm^3$ for providing a p-type specific resistance, to give a material for silicon crystals. This material was accommodated in the crucible 85 of high-purity carbon. Subsequently, the inside of the chamber 82 was vacuumed and the pressure in the chamber 82 was reduced to $3 \times 10^{-4}$ torr. Argon gas was introduced into the chamber 82 to recover the atmospheric pressure in the chamber. Thereafter, argon gas was flown at 10 L/min from a side part of the chamber.

Next, the temperature of the heater 81 was set to 1,500° C. A melt S1 without solids was obtained. The silicon material was fed again to adjust the level of the surface of the melt S1. The temperature of the heater 81 was set to 1,430° C. and maintained at that temperature for thirty minutes to stabilize the temperature. Then, nitrogen gas as the refrigerant was passed through the inside of the sprocket 93b at a flow rate of 500 L/min to cool the cooling member 91. The crucible 85 was raised by the crucible elevating section 86 so that the cooling face 91a at the bottommost was immersed at a depth of 5 mm from the surface of the melt S1. In this state, the cooling member belt 92 was revolved in the direction of the arrows in FIG. 8 at a rotating speed of 50 cm/min. The polycrystalline silicon sheet S2 grown on the cooling face 91a rose as the cooling member belt rotated. When the cooling face 91a of the cooling plate 91 reached the position opposed to the distal end of the suction case 89 of the stripping mechanism 88, the vacuum pump was driven so that the polycrystalline silicon sheet S2 was taken by suction onto the distal end of the suction case 89. Thereafter, the drive of the vacuum pump was stopped and the polycrystalline silicon sheet S2 was taken out.

The obtained polycrystalline silicon sheet S2 was 350 μm in thickness.

The polycrystalline silicon sheet S2 was made into a solar cell using a usual process of producing polycrystalline solar cells. An open circuit voltage over 570 mV and a fill factor over 0.75 were measured.

According to the present invention, the sheet adhering portion formed on the cooling face serves as the starting point of crystallization for growing crystals and allows the adhesion of the grown polycrystalline silicon sheet. Also, in the rest part of the cooling face, provided is the sheet stripping portion to which the grown polycrystalline silicon adheres only weakly or does not adhere at all. Thereby, it is possible to realize both the adhesion of the sheet resulted from the growth of crystals and the easy stripping of the sheet.

Accordingly, it is possible to obtain the sheet having a desired crystal form grown from the sheet adhering portion as the starting point of crystallization and to facilitate the stripping of the sheet without need of a stripping agent as conventionally used.

The crystal form of the polycrystalline silicon sheet is columnar crystals which grow from the sheet adhering portion as the starting point of crystallization and have vertices at the sheet adhering portion. Thus, it is possible to obtain a polycrystalline silicon sheet suitable for solar cells and the like.

Also, the growth of crystals can be stabilized, and the polycrystalline silicon sheets for solar cells can be mass-produced at lower costs from a smaller amount of silicon starting material than used by the conventional casting method.

Further, high-quality polycrystalline silicon sheets can be produced since they can be stripped from a cooling member without using stripping agents.

What is claimed is:

1. An apparatus for producing a polycrystalline silicon sheet, the apparatus comprising:
    a crucible;
    a heating unit for heating a starting material comprising silicon in the crucible; and
    a cooling unit for contacting a melt of the starting material melted by heating to a cooling face of a cooling member, thereby obtaining a polycrystalline silicon sheet in which crystals of silicon are grown,
    wherein the cooling face of the cooling member has a sheet adhering portion for providing a silicon starting point of crystallization and allowing adhesion of the polycrystalline silicon sheet of grown crystals and a sheet stripping portion for allowing easy stripping of the polycrystalline silicon sheet, and wherein the sheet stripping portion comprises an exposed surface of a plate of the cooling member and the sheet adhering portion comprises a plurality of separate projections extending from the plate.

2. An apparatus according to claim 1, wherein the sheet adhering portion occupies 0.1 to 25% of the cooling face.

3. An apparatus according to claim 1, wherein the cooling unit comprises a rotary cylinder having the cooling face on its periphery.

4. An apparatus according to any claim 1, wherein the cooling member comprises a plurality of cooling member pieces each having a flat cooling face, the cooling member pieces being connected to each other in a caterpillar form, and the caterpillar-form cooling member pieces revolves in an up-and down direction with respect to the crucible in such a manner that 1 to 50 of the cooling member pieces contact the melt sequentially.

5. An apparatus according to claim 4, further comprising a sheet stripping mechanism provided with at least one suction case having at a distal end a porous surface disposed to face the cooling faces of the revolving cooling member pieces and with a vacuum pump for, when the suction case faces the cooling face to which the polycrystalline silicon sheet adheres, sucking the inside of the suction case from a proximal side to take the polycrystalline silicon sheet onto the porous surface by suction.

6. An apparatus according to claim 1, wherein the sheet stripping portion is formed of carbon.

7. A process for producing a polycrystalline silicon sheet with use of an apparatus for producing a polycrystalline silicon sheet as set forth in claim 1.

8. An apparatus for producing a polycrystalline silicon sheet, the apparatus comprising:

a crucible;

a heating unit for heating a starting material comprising silicon in the crucible; and a cooling unit for contacting a melt of the starting material melted by heating to a cooling face of a cooling member, thereby obtaining a polycrystalline silicon sheet in which crystals of silicon are grown, wherein the cooling face of the cooling member has a sheet adhering portion for providing a silicon starting point of crystallization and allowing adhesion of the polycrystalline silicon sheet of grown crystals and a sheet stripping portion for allowing easy stripping of the polycrystalline silicon sheet, and wherein the sheet stripping portion occupies more of the area of the cooling face than does the sheet adhering portion.

9. An apparatus for producing a polycrystalline silicon sheet, the apparatus comprising:

a crucible;

a heating unit for heating a starting material comprising silicon in the crucible;

a cooling unit for contacting a melt of the starting material melted by heating to a cooling face of a cooling member, thereby obtaining a polycrystalline silicon sheet in which crystals of silicon are grown, wherein the cooling face of the cooling member has a sheet adhering portion for providing a silicon starting point of crystallization and allowing adhesion of the polycrystalline silicon sheet of grown crystals and a sheet stripping portion for allowing easy stripping of the polycrystalline silicon sheet, and wherein the sheet adhering portion comprises dots of a ceramic arranged on the cooling face.

10. An apparatus according to claim 9, wherein the ceramic contains any one of silicon carbide, silicon nitride and boron nitride.

* * * * *